(12) United States Patent
Ayyapureddi

(10) Patent No.: US 11,342,041 B2
(45) Date of Patent: May 24, 2022

(54) APPARATUSES, SYSTEMS, AND METHODS FOR PROBABILISTIC DATA STRUCTURES FOR ERROR TRACKING

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 17/003,486

(22) Filed: Aug. 26, 2020

(65) Prior Publication Data

US 2022/0068427 A1  Mar. 3, 2022

(51) Int. Cl.
*G11C 29/18* (2006.01)
*G11C 29/44* (2006.01)
*G11C 29/42* (2006.01)
*G11C 29/12* (2006.01)

(52) U.S. Cl.
CPC ........ *G11C 29/44* (2013.01); *G11C 29/12015* (2013.01); *G11C 29/18* (2013.01); *G11C 29/42* (2013.01); *G11C 2029/4402* (2013.01)

(58) Field of Classification Search
CPC ... G11C 29/44; G11C 29/12015; G11C 29/18; G11C 29/42; G11C 2029/4402
See application file for complete search history.

(56) References Cited

U.S. PATENT DOCUMENTS

2016/0350180 A1\* 12/2016 Halbert .................. G11C 29/42
2021/0011804 A1\* 1/2021 Wiita .................. G06F 11/1072

\* cited by examiner

*Primary Examiner* — Mohammed A Bashar
(74) *Attorney, Agent, or Firm* — Dorsey & Whitney LLP

(57) ABSTRACT

Apparatuses, systems, and methods for probabilistic data structures for error tracking. A memory device may include an error code correction (ECC) circuit which determines if data read from a memory array includes an error. If it does, the row address associated with the read data is provided to an error tracking circuit. The error tracking circuit may use probabilistic data structures, such as multiple count values, each indexed by different hash values of the row address. The count values may be used to determine if a given row address is repeatedly associated with errors. The memory may store these identified problem addresses in a data storage structure for example for diagnostic and/or repair purposes.

20 Claims, 7 Drawing Sheets

APPARATUSES, SYSTEMS, AND METHODS FOR PROBABILISTIC DATA STRUCTURES FOR ERROR TRACKING

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors.

DETAILED DESCRIPTION

Figure 1:
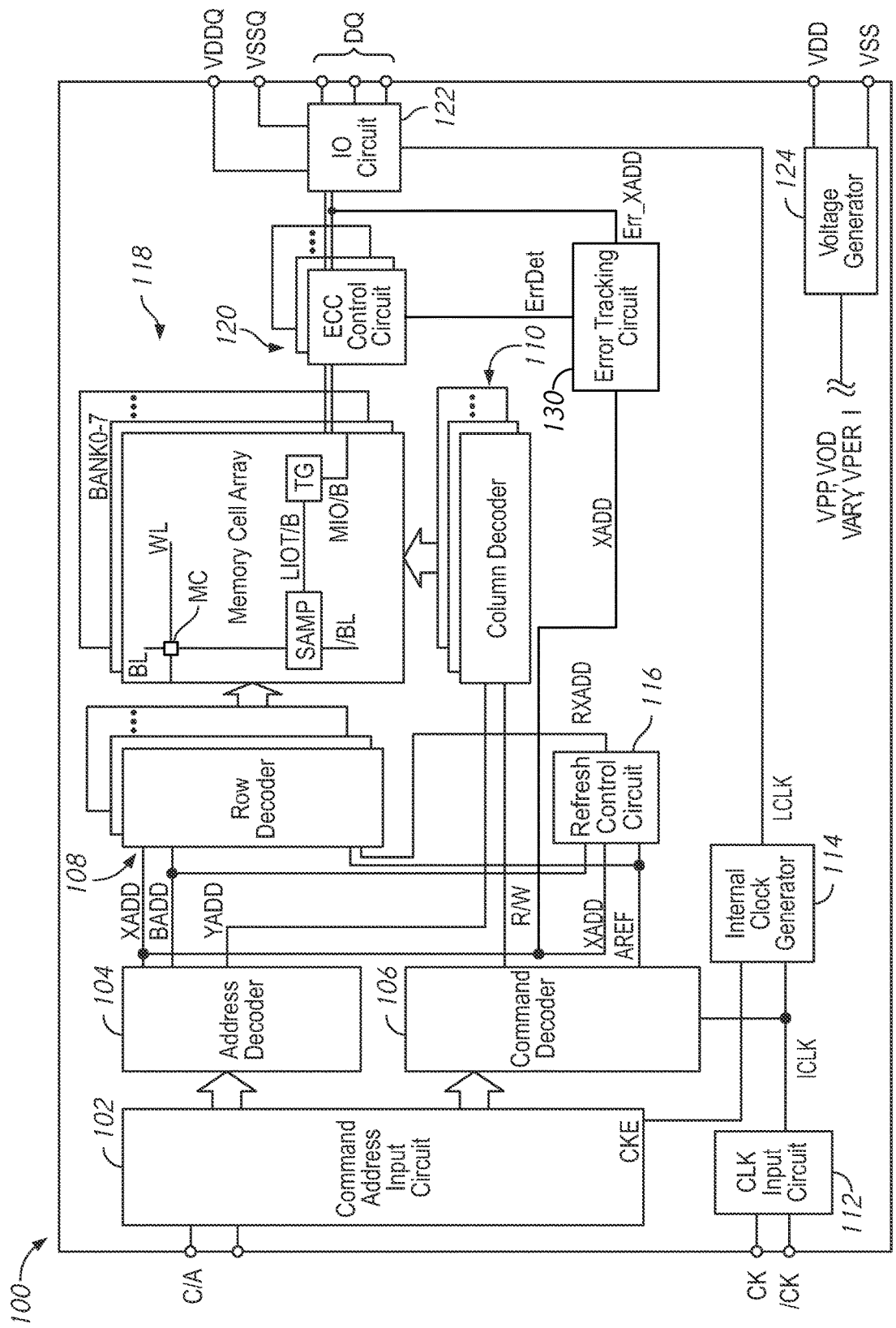
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include i data bits and k parity bits, which may be used to correct up to j of the data bits. During a write operation the parity bits may be generated by an error correction circuit based on the data written to the memory cells of the row. During a read operation the error correction circuit may use the parity bits to determine if the read data bits are correct, and may correct any errors which are found.

In addition to correcting the information, it may be useful for the memory to track which memory cells are defective. For example, the memory may keep track of the most recent row address associated with a read operation that contained one or more error bits. However, there may be a need for tracking multiple problem addresses within a memory, and/or for more sophisticated analysis of which address(es) are 'problem addresses' associated with a meaningful number of times that data read out from the word lines associated with those addresses includes an error.

The present disclosure is directed to apparatuses, systems, and methods for probabilistic data structures for error tracking. The memory may include an error correction code (ECC) circuit and an error tracker circuit. When the ECC circuit detects an error in the read data it may provide the row address associated with that read operation to the error tracker circuit. The error tracker circuit may include a first hash circuit which may hash the row address into an n-bit hash, and a second hash circuit which may hash the row address into an m-bit hash. The error tracker circuit may change a first count value associated with the value of the n-bit hash and a second count value associated with the value of the m-bit hash. Based on the value of these counts, the error tracker circuit may determine if the address is a problem address associated with frequent errors. The error tracker may store such problem addresses in a problem storage circuit. The problem addresses in the problem storage circuit may be retrieved by a controller of the memory and/or may be used as part of one or more repair operations (e.g., a post-package repair).

The use of multiple hash circuits (and multiple lengths of hashes) may be useful, because it may reduce the total number of count values that the memory is required to track, while still maintaining a relatively high degree of statistical meaningfulness to the tracking. The use of hash circuits may lead to collisions, where multiple addresses may be associated with the same value of the hash (e.g., the same count value). However the use of multiple different hash circuits means that while a first address and second address may collide in the first hash circuit, they may not in the second. While there may be more collisions between addresses in shorter hashes (e.g., count values associated with shorter hash values may be associated with more word lines), the longer hashes may still have less collisions, which may balance out the shorter hashes. Since a count value must be maintained for each value of each hash, which is based on the length of hash, the use of hashes of different length may reduce the total number of count values which need to be stored. This may lead to the probabilistic nature of the error tracking, since the hash and count value scheme does not necessarily guarantee that a given problem row will be accurately identified, but does have reasonably high odds of identifying such a row for a relatively small number of tracked count values.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data. The corrected read data is output to outside the device 100 from the data terminals DQ via the input/output circuit 122. When the ECC control circuit 120 determines that the read data includes an error, it may provide the error detected signal ErrDet at an active level.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found. For example, the ECC control circuit 120 may be able to locate and correct up to one error in the 128 data bits based on the 8 parity bits. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments. An example ECC circuit is discussed in more detail in FIG. 5.

The memory may include an error tracking circuit 130, which may track which memory cells (if any) are associated with relatively frequent problems. For example, the error tracking circuit 130 may track rows of the memory array 118 which have been identified as including an error bit during read operations. The ECC control circuit 120 may provide the signal ErrDet at an active level to indicate that an error bit has been detected. The error tracking circuit 130 may receive the row address XADD, responsive to the signal ErrDet at an active level. The error tracking circuit 130 may include one or more count values associated with the received address. Based on the value of one or more of those count values, the error tracking circuit may determine if the row is a 'problem row' Err_XADD associated with a relatively high number of errors, and if so may store the identified problem row Err_XADD in a problem storage structure (e.g., a stack of registers). In some embodiments, the identified problem rows Eff_XADD may be read out of the error tracking circuit 130 (e.g., out to the data terminals DQ). In some embodiments, the identified problem rows Err_XADD may be used as part of a repair operation (e.g., a post-package repair operation). The repair operation may include redirecting the problem address Err_XADD to a redundant row of memory.

The error tracking circuit 130 may use count values to track the number of times that each address has been associated with an error bit. However, it may be impractical to store a count value for each of the different row addresses. The error tracking circuit 130 may use count values which are associated with multiple row addresses. The error tracking circuit 130 may use hash circuits to compress the row address into a hash value, and may use the hash value as an index for the count values. Since each count value matches several addresses, based on what count value, the error tracking circuit 130 may not be able to tell which address associated with a count value is a problem based on a single count value. Accordingly, the error tracking circuit 130 may include multiple hash circuits, each of which generates a hash used to index a different set of count values. The hash circuits may be independent of each other, such that the hash value generated by a given address is not necessarily the same between different hash circuits. This may mean that each count value is associated with a different set of address values. Similarly, when a given address is received (e.g., due to ErrDet being active) multiple count values may be indexed and may be updated. The error tracking circuit 130 may use one of these count values (and/or some value based on one or more of these count values) as a comparison value, and may compare it to a threshold. If the comparison value is greater than the threshold, then the address XADD may be stored in the problem address storage.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
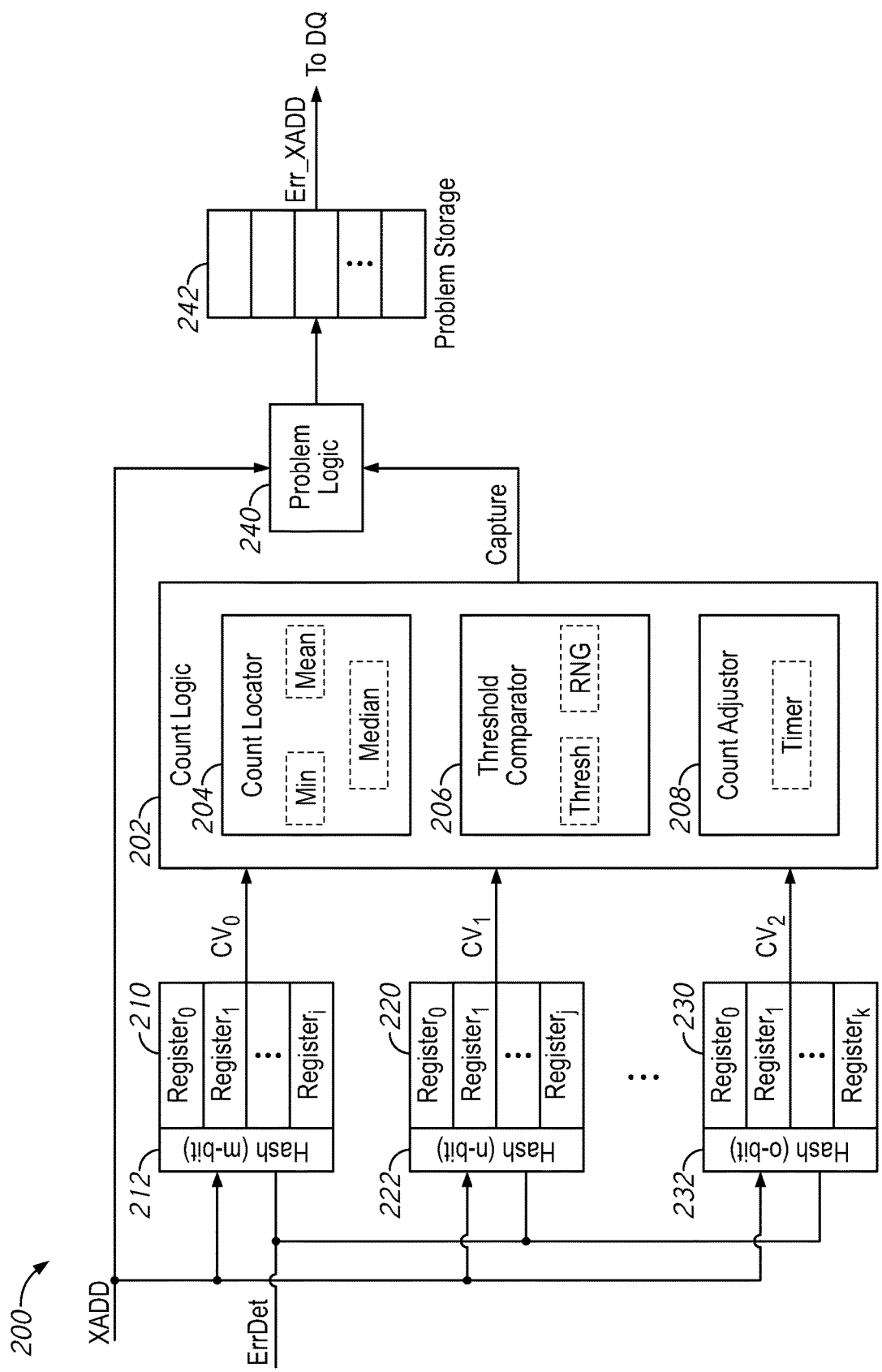
FIG. 2 is a block diagram of an error tracking circuit according to some embodiments of the present disclosure.

FIG. 2 is a block diagram of an error tracking circuit according to some embodiments of the present disclosure. The error tracking circuit 200 may, in some embodiments, be included in the error tracking circuit 130 of FIG. 1.

The error tracker circuit 200 includes a number of hash circuits, 212, 222, and 232, each which hashes a row address XADD along the row address bus when the signal ErrDet (e.g., as provided by the ECC circuit 120 of FIG. 1) is active to indicate that at least one bit read from the word line associated with the row address XADD included an error. Each hash circuit 212, 222, and 232 may change a count value stored in one of the registers of an associated data stack 210, 220, and 230, respectively based on the value of the hash generated by that respective hash circuit. The changed count values (e.g., the count values associated with the row address XADD) may be provided to a count logic circuit 202, which may use the provided count values to determine if the row address XADD is associated with a problem row. If the count logic 202 determines that the row address XADD is problem row, then problem logic 240 may store the row address XADD in a problem storage structure 242. The addresses stored in the problem storage 242 may be read off of the memory for diagnostic purposes and/or may be used to repair the row (e.g., by redirecting the row address XADD to a redundant row of memory).

The count logic circuit 202 of FIG. 2 shows a number of sub-components for each of the count locator 204, threshold comparator 206, and count adjustor 208. These sub-components are shown as dotted line boxes, and are optional components of the count logic 202. In some embodiments, the dotted line sub-components may represent system level components of the memory which are coupled to the count logic circuit 202. For example, the timer sub-component may be coupled to a clock signal of the memory (e.g., ICLK of FIG. 1). In some embodiments, the sub-components may represent optional features of the error tracking circuit 200 and may be enabled/disabled by user setting (e.g., via mode register setting, via fuses, etc.).

The error tracking circuit 200 includes a number of hash circuits such as 212, 222, and 232, each of which is associated with a data stack (e.g., 210, 220, and 230), respectively. Since the hash circuits and data stacks may generally be similar to each other, for the sake of brevity only the first hash circuit 212 and data stack 210 will be described in detail.

The first hash circuit 212 may be an m-bit hash circuit. Responsive to the signal ErrDet at an active level, the first hash circuit 212 may receive the row address XADD off the row address bus, and may convert it into an m-bit hash value. For example, the row address XADD may be a certain number of bits (e.g., 17 bits). The first hash circuit 212 may hash row address XADD into an m-bit number. The number of bits, m, may generally be less than the number of bits in the unhashed row address XADD. Accordingly, multiple values of the row address XADD may be associated with a given value of the m-bit hash.

The data stack 210 may be any structure capable of storing a number of different count values. For example, the data stack 210 may include a number of registers, each of which may store a count value (e.g., as a binary number). The data stack 210 may hold a number of count values equal to number of possible values of the m-bit hash value (e.g., $2^{nd}$ different count values). For example, if the first hash circuit 212 is an 8-bit hash circuit, then the data stack 210 may include 256 different count values. Accordingly, each count value may be associated with one of the values of the m-bit hash value.

When the hash circuit 212 receives the row address XADD, it may provide an m-bit hash value associated with a value of the row address XADD. Responsive to the m-bit hash value, the count value in the data stack 210 associated with that value of the m-bit hash value may be changed (e.g., incremented). In some embodiments, the count value $CV_0$ associated with the value of the m-bit hash (e.g., associated with the row address XADD) may be provided to a count logic circuit 202, which may change the count value $CV_0$ and then rewrite it into the data stack 210.

The different hash circuits 212, 222, and 232 may be independent of each other. Accordingly, a given row address may be hashed into a first value by the first hash circuit 212, and into a second hash value by the second hash circuit 222. The first hash value and the second hash value are not necessarily the same value (although they may be). Since the hash values act as indices for the count value, this means that each count value may be associated with a different set of row addresses.

The different hash circuits 212, 222, and 232 may all generate different lengths of hash. For example, the first hash circuit 212 may be an m-bit hash circuit, the second hash circuit 222 may be an n-bit hash circuit, and the third hash circuit 232 may be an o-bit hash circuit, where m, n, and o are different numbers. Accordingly, the associated data stacks 210, 220, and 230 may hold different numbers of count values. For example m may be an 8 bit hash, and the first data stack 210 may hold 256 count values, n may be 7 and the second data stack 220 may hold 128 different count values, and o may be 6 and the third data stack 230 may hold 64 different count values. Different lengths of hash may be used in other example embodiments. The use of different hashes means that each count value may be associated with different numbers of row addresses.

The hash circuits 212, 222, and 232 may each receive a set of hash keys (not shown), which may determine, in part, the value of the hash generated responsive to a received row address. The hash keys may be stored in the memory (e.g., in a set of latches, in a mode register, etc.) and may be received by the hash circuits 212, 222, and 232. Each hash circuit may receive a set of hash keys which have a length based on length of the hash value, and there may be a number of hash keys based on a number of bits in the received row address. For example, if the row address is R bits long, then the first hash circuit 212 may receive a first set of hash keys which includes R individual keys, each of which is an m-bit binary number. The second hash circuit 222 may receive a second set of hash keys which includes R individual keys, each of which is an n-bit binary number. The third hash circuit 232 may receive a third set of hash keys which includes R individual keys, each of which is o-bit binary number.

In some embodiments, each set of hash keys may be independent from each other. In some embodiments, one or more individual keys may be shared between the sets of keys, but may be truncated to account for the different lengths of hash output. In some embodiments, the memory device may generate the hash keys. For example a random number generator may generate the hash keys based on a seed value.

Responsive to a row address XADD, each of the data stacks 210, 220, and 230 may provide a respective count value CV0, CV1, and CV2 to the count logic circuit 202. These count values may be different from each other, because each may be associated with a different set (and a different number) of values of the row address XADD. A count adjustor circuit 208 of the count logic 202 may update the received values, for example by incrementing them. In some embodiments, how the count adjustor 208 changes the count values CV0 to CV2 may be partially dependent on the values of the count values CV0 to CV2. For example, the count value CV1 may only be changed (e.g., incremented) if the value CV0 is above a threshold (e.g., has reached a maximum value).

In some embodiments, the count adjustor circuit 208 may periodically change the count values in a different direction (e.g., decrease them). For example, after a set period of time (e.g., a certain number of clock cycles), the count adjustor 208 may change (e.g., decrease) all of the count values stored in the data stacks 210, 220, and 230. In some embodiments, the count adjustor 208 may reduce the count values to a minimum value by resetting them (e.g., to 0).

A count locator circuit 204 may select one of the received counts, or may synthesize a new value based on the set of count values CV0 to CV2. The count locator circuit 204 may use one or more statistics based on the set of count values CV0 to CV2. For example, the count locator circuit 204 may compare the count values CV0 to CV2 and take the minimum. The count locator circuit 204 may also generate a statistic based on the set of count values, and may, for example, provide the mean or median value of CV0 to CV2. In some embodiments, only one of the minimum, median, and mean may be provided. In some embodiments, a user may be able to select which statistic is used. In some embodiments, all three of the minimum, median, and mean may be calculated and output by the count locator, and may be used separately. Other statistics may be used in other example embodiments.

In some embodiments, rather than using a statistic, the count locator 204 may select one of the count values CV0 to CV2. For example, in embodiments there each count value is changed only if a previous count value is above a threshold (e.g., CV1 is changed if CV0 is greater than a threshold), then a particular count value (e.g., CV2) may be provided by the count locator 204. In some embodiments, which count value is used may be changed periodically. For example a count value may be randomly selected.

The count locator circuit 204 may provide the statistic (e.g., the minimum) to a threshold comparator circuit 206. The threshold comparator circuit 206 may compare the received statistic to a threshold value Thresh. If the threshold comparator circuit 206 determines that the received statistic is greater than the value Thresh, then the count logic circuit 202 may provide a capture signal Capture at an active level (e.g., a high logical level, a pulse, a rising edge, etc.). In some embodiments, the threshold may be periodically changed. For example, the threshold Thresh may be randomly varied based on the output of a random number generator RNG.

A problem logic circuit 240 may receive the signal Capture. When the signal Capture is active, the problem logic circuit 240 may store the current value of the row address XADD in a problem address storage 242. The problem address storage 242 may be a data structure with a number of registers, each of which may be used to store an identified problem row address XADD. In some embodiments, the addresses stored in the problem address storage 242 may be provided off the memory. For example, a controller may perform a read operation and specify the problem address storage and may retrieve the list of problem addresses. In some embodiments, these addresses may be deleted from the storage when they are read out. In some embodiments, when the addresses are read out, the count adjustor 208 may reduce the count values associated with those addresses. In some embodiments, the addresses in the problem address storage 242 may be repaired.

In some embodiments, various features of the error tracking circuit 200 may be user selectable. For example, a user may be able to set one or more modes of operation of the error tracking circuit, and/or may be able to enable or disable specific features. In some embodiments, the user may be able to select whether the minimum, the mean, or the median is used to generate the comparison value. Similarly, the threshold used by the threshold comparator 206 may be user selectable. In some embodiments, the user may be able to select an operational mode, for example by choosing whether each count value associated with a row address is updated (e.g., incremented) or whether the counts are updated in a 'cascade' fashion, with a count value from the first stack (e.g., 210) needing to reach a threshold value before a count value in a next stack (e.g., 220) is updated.

Figure 3:
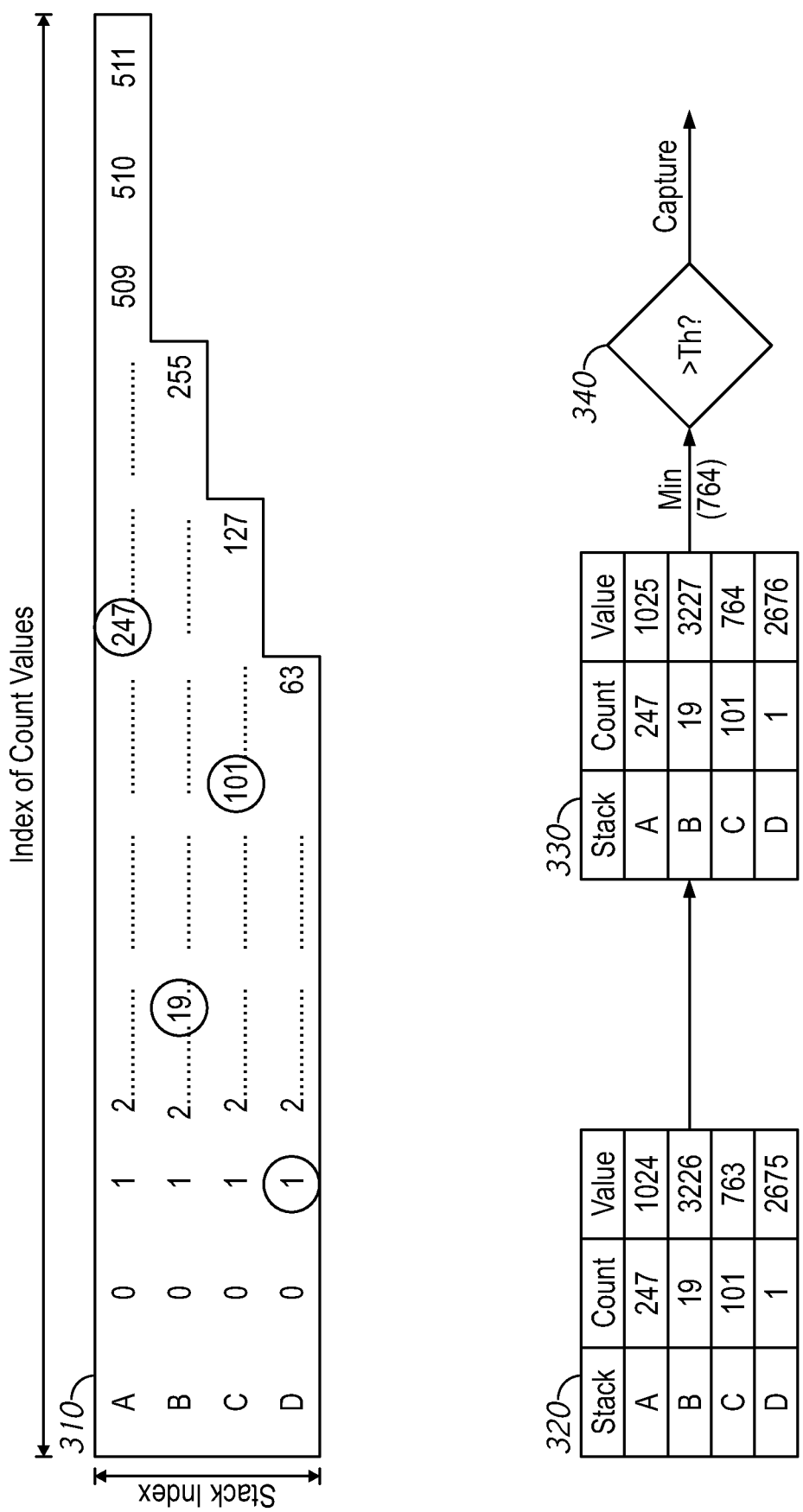
FIG. 3 is a set of block diagrams showing an example operation of a set of data structures according to some embodiments of the present disclosure.

FIG. 3 is a set of block diagrams showing an example operation of a set of data structures according to some embodiments of the present disclosure. The block diagrams of FIG. 3 represent the operation of different components of an error tracking station. The block diagrams represent the flow of data within various components, without necessarily showing the structure of such components. In some embodiments, the example block diagrams of FIG. 3 may represent the operation of an error tracking circuit, such as the error tracking circuit 130 of FIG. 1 and/or 200 of FIG. 2.

FIG. 3 shows a count storage block diagram 310 which represents the indices of count value stored within various data storage structures (e.g., 210, 220, and 230 of FIG. 2), each of which stores a number of count values associated with an associated hash circuit. The count storage diagram 310 shows an index of the storage structure (e.g., a stack) along a vertical axis, and shows an index of the stored count value along a horizontal axis. For clarity, letters (e.g., A to D in this example) are used to index the different stacks, while numbers are used to index the count values. Note that the numbers shown in the diagram 310 represent the indices of the various count values, not the value of that count value.

In the example diagram 310 of FIG. 3, each of the data storage structures A-D is associated with a hash circuit which generates a different length of hash value. For example, the first data storage structure A is associated with a 9-bit hash circuit, which generates a 9-bit number (e.g., 512 total values). Accordingly, the data storage structure A may store 512 different count values, indexed 0 to 511. Similarly, the data structure B is associated with an 8-bit hash (e.g., 256 total values), the data structure C is associated with a 7-bit hash (e.g., 128 total values), and the data structure D is associated with a 6-bit hash (e.g., 64 total values). Accordingly, overall a memory with these four data structures would need to store 960 total values (e.g., 512+256+128+64). In contrast, if the memory included four data structures each using an 8-bit hash, 1,024 different values would need to be tracked (e.g., 4*256).

When a row address is received (e.g., when the signal ErrDet is received), each of the hash circuits may generate a hash based on the value of the row address. The circles on the block diagram 310 show an example set of count values which may be activated by a given row address. The first hash circuit may hash the address into the value 247, the second hash value may hash the address into the value 19, the third hash circuit may hash the address into the value 101, and the fourth hash circuit may hash the address into the value 1. These are represented in the count value table 320.

The count value table 320 shows the actual count values associated with the count indices which were associated with the row address. For example, the count associated with a hash value of 247 in stack A has a value of 1024 at the time the row address XADD is received by the first hash circuit. Accordingly the value 1024 may be provided as a count value (e.g., CV0 of FIG. 2) to a count logic circuit (e.g., 202 of FIG. 2).

Table 330 is similar to table 320, except that table 330 represents the count values which have been updated by the count adjustor (e.g., 208 of FIG. 2). For example, each of the count values has been incremented (e.g., the value of count 247 of stack A is increased to 1025 from 1024). These count values may be written back to the stacks. The updated count values shown in table 330 may also be used to generate a statistics to compare to a threshold.

In some embodiments, the different data stacks may store the count values as the same length of binary number. In some embodiments, the different data stacks may store the count values as different lengths of binary number. For example, since there are more collisions in the data storage structure D, each count value may generally be expected to be updated (e.g., increased) more frequently than the count values in the data storage structure A (since there are less collisions in structure A since A is associated with a longer value of hash). Accordingly, in some embodiments, more bits may be used to store each of the count values in the lower data structures than in the higher data structures.

Each count value may represent a number of times that the address values which are hashed into the hash value which indexes that count have been received (e.g., identified as containing an error bit). The counts values may be different from each other because each count value may be associated with a different set of address values. In the example of FIG. 3, the example row address is associated with the count values 1025, 3227, 764, and 2676. The count locator circuit (e.g., 204 of FIG. 2) may select the minimum count value, which in this case is 764. The count value selected by the count locator (and/or the value synthesized by the count locator) may be provided to a comparator 340. The comparator 340 (e.g., threshold comparator 206 of FIG. 2) may determine if the value is over a threshold. If the value is over the threshold, the comparator 340 may provide the signal Capture at an active level, which may cause a current value of the row address (e.g., the one associated with the circled count values) to be stored in a problem storage structure (e.g., 242 of FIG. 2).

Figure 4:
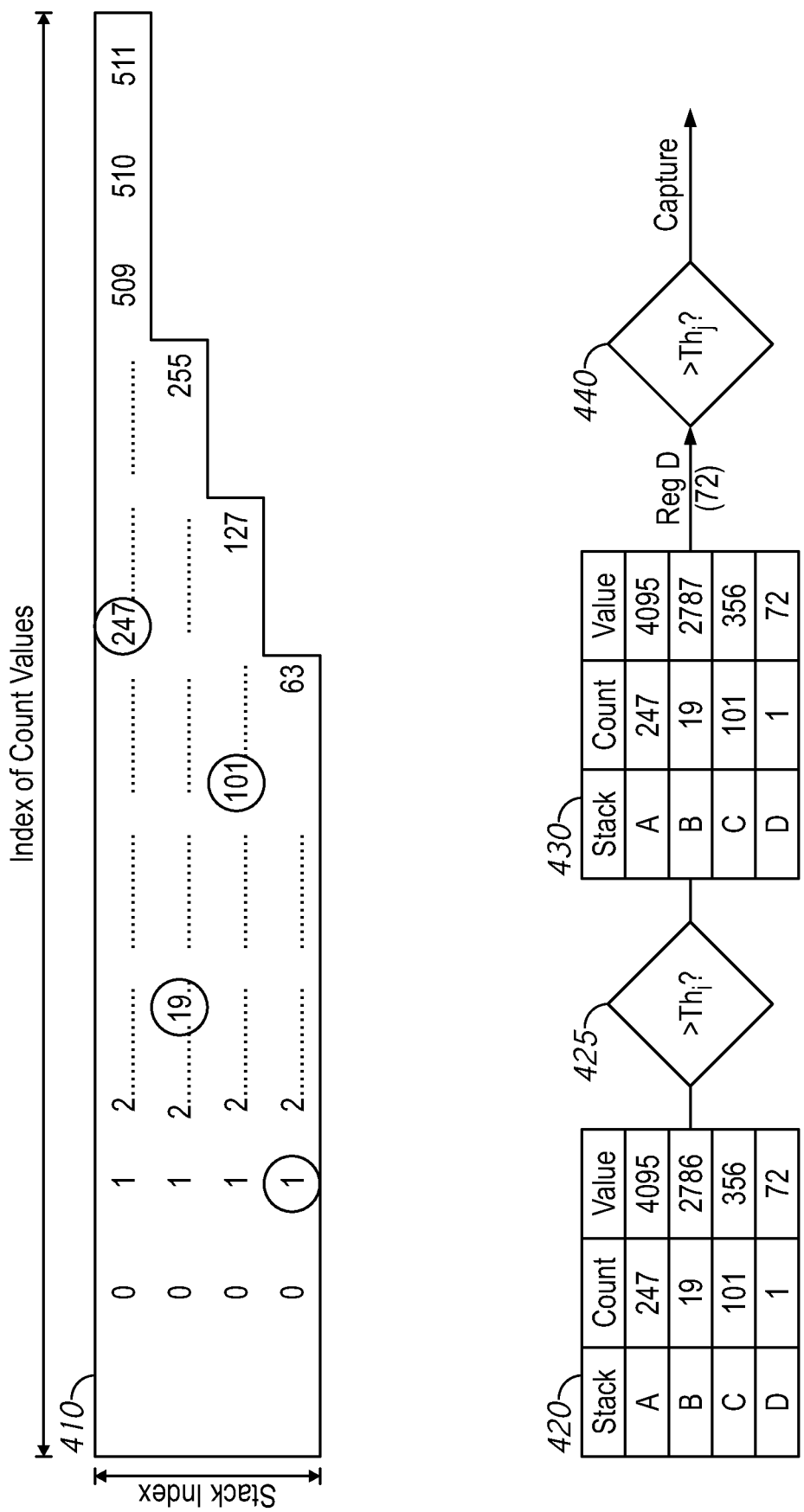
FIG. 4 is a set of block diagrams showing an example operation of a set of data structures according to some embodiments of the present disclosure.

FIG. 4 is a set of block diagrams showing an example operation of a set of data structures according to some embodiments of the present disclosure. FIG. 4 shows an example where all of the count values associated with a given address are not necessarily changed. The elements of FIG. 4 may generally be similar to the elements of FIG. 3, and for the sake of brevity, elements of FIG. 4 similar to those of FIG. 3 will not be described again.

An address is received which is associated with count values in each of four registers, as shown in the block diagram 410. Table 420 shows the indices of the count values and the value of those count values. In particular, the address is associated with a count value of 4095 in stack A, a count of 2786 in stack B, a value of 357 in stack C, and a value of 72 in Stack D. Table 420 shows the count values after they have been updated responsive to receiving the row address associated with these values. However, unlike in FIG. 3, in FIG. 4, the count values are updated in a cascading fashion. In the cascading update fashion, the count value from the first stack (e.g., stack A) is checked by a comparator 425 to see if it is over a threshold. If the count is under the threshold, the count value from the first stack is updated (e.g., incremented). If the count value is at or above the threshold, then the count value from the next stack (e.g., stack B) may be checked by the comparator 425.

In the example of FIG. 4, the count values may be stored as 12 bit numbers (e.g., a value from 0 to 4,095). The threshold Thj used by the first comparator may be the maximum value of the count value (e.g., 4,095). Accordingly, when the row address is received, the first comparator 425 may check the first value, which in this case is at the threshold (e.g., is the maximum value of 4,095). Since the first count value (e.g., the count from stack A) is at the threshold, the comparator 425 may check the second count value (e.g., the one from stack B). Since that count value (e.g., 2,786) is below the threshold Thi of the first comparator 425, the count value associated with the second stack may be changed (e.g., incremented) as shown in table 430. Since the count value in the second stack was not at or above the threshold of the first comparator 425, the counts in the remaining data structures (e.g., the counts retrieved from stacks C and D) are not checked or updated.

In some embodiments, the number of bits used to store the count values may be of different lengths. For example, when count values are updated in the 'cascading' fashion, it may generally be expected that the counts in lower data structures (e.g., in stack D) may be of lower value than the counts in the higher data structures (e.g., in stack A). Accordingly, fewer bits may be used to store the count value in lower data structures. For example, 12 bits may be used to store each of the count values in the top data structure (e.g., in stack A) while 8 bits may be used to store each of the count values in the bottom data structure (e.g., in stack D). Other example numbers of bits may be used in other examples. This may further reduce the amount of bits (total) which are tracked in the collected data structures.

In the example of FIG. 4, instead of calculating a statistic based on the set of count values, a count value may be selected based on which data structure it's in. For example, the count value of the last data stack (e.g., stack D) may be used. In the example of FIG. 4, that value is 72. In some embodiments, other data stacks may be used to select the value for comparison by the second comparator 440. In some embodiments, which data structure's count value is used may be varied (e.g., may be randomly chosen). In some embodiments, each data stack may be associated with a different threshold in the comparator 440

Figure 5:
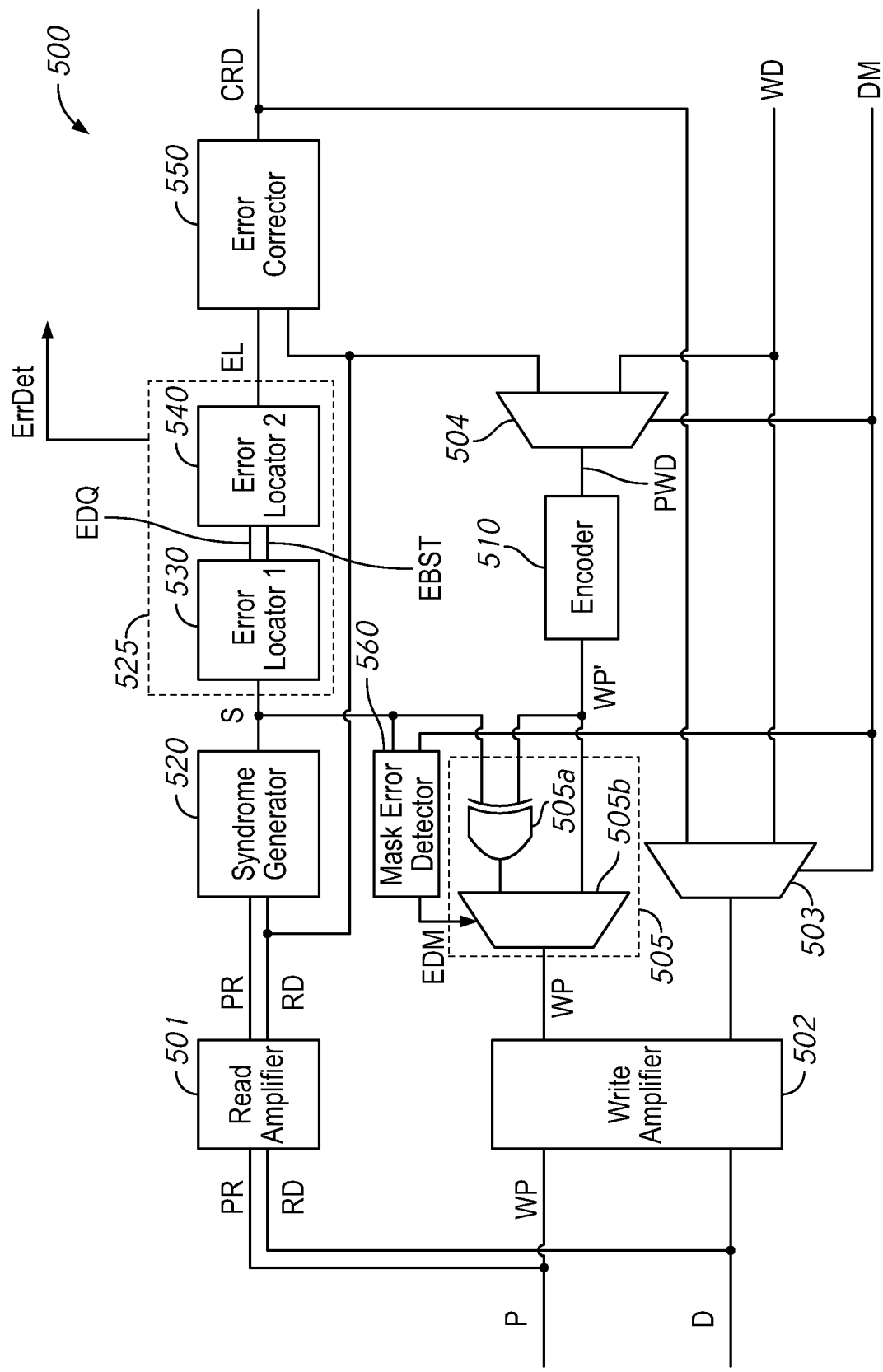
FIG. 5 is a schematic diagram of an error correction code (ECC) control circuit according to some embodiments of the present disclosure.

FIG. 5 is a schematic diagram of an error correction code (ECC) control circuit according to some embodiments of the present disclosure. The ECC control circuit 500 of FIG. 5 may, in some embodiments, be included in the ECC control circuit 120 of FIG. 1. The ECC control circuit 500 may receive write data bits WD and may generate written parity bits WP. These may be provided to the memory array as data bits D and parity bits P. The ECC control circuit 500 may receive data D from the memory array as read data RD and parity bits P as read parity bits PR and may generate corrected data bits CRD based on the bits RD and PR.

During an example read operation, the read amplifier 501 is activated to amplify the read parity bits PR and read data RD. The amplified bits PR and RD are provided to a syndrome generator circuit 520. The syndrome generator 520 provides syndrome bits S based on the read bits RD and PR. In some embodiments, the number of syndrome bits S may match the number of parity bits PR. The syndrome bits S are provided to an error locator circuit 525.

The error locator circuit 525 includes two portions, a first error locator circuit 530 and a second error locator circuit 540. The first error locator circuit 530 provides a first set of error determination signals EBST and a second set of error determination bits EDQ based, in part, on the syndrome bits S. Data provided to/received at the DQ terminals may be organized into bursts on a number of different DQ terminals (e.g., a burst of 8 bits on each of 16 different DQ terminals for 128 total bits). The first set of error determination signals EBST may indicate a location of an error bit within a burst. In some embodiments, there may be a bit for each of the bits in the burst, and the signals EBST may be provided in common to the DQ terminals. The second set of error determination signals EDQ may indicate which of the DQ terminals the error bit is being provided to. In some embodiments, there may be a bit for each DQ terminal, and the signals EDQ may be provided in common with the burst bits.

The error determination signals EBST and EDQ may be provided to the second error locator circuit 540. The second error locator circuit 540 may decode the signals EBST and EDQ to identify a location of an error bit in the read data RD. The location of the error bit may be specified by an error location signal EL. In some embodiments, there may be a number of bits of the error location signal EL based on the number of bits of the read data RD, with each bit of the error location signal EL associated with a bit of the read data RD.

The error locator circuit 525 may provide the signal ErrDet at an active level when an error is detected in the read data RD. For example, based on the syndrome signals S, the error locator circuit 525 provides the signal ErrDet. The signals from the first or the second error locator circuits 530 and 540 may be used as an error detected signal ErrDet. For example, error detection logic may receive one or more of the signals EDQ, DBST, and ELT and provide the signal ErrDet at an active level responsive to at least one of those signals being at an active level.

The error position signal EL is provided to error corrector circuit 550. The error corrector circuit 550 also receives the read data RD and corrects one or more error bits in the RD based on the error location signal EL. For example, if an nth bit of the error location signal EL is at a high logical level, then the error corrector circuit 550 may change a state of the nth read bit RD. The error corrector circuit 550 may provide the corrected read data CRD. The corrected read data CRD may be provided to the DQ pads and read off of the device.

In an example write operation to the memory device, the ECC control circuit 500 may receive write data WD and a data mask signal DM. A first multiplexer 503 may synthesize the write data WD and the corrected read data CRD based on the data mask signal DM. The first multiplexer 503 may provide the data D, which is written to the memory array. In some embodiments, the data mask signals DM may be associated with the different burst bits received at the data terminals. When one (or more) of the data mask bits DM is active, then the write data WD associated with that data mask bit may be replaced by the corrected read data CRD in the data D.

A second multiplexer 504 may synthesize the write data WD and the read data RD based on the data mask signal. The second multiplexer 504 may provide parity write data PWD. The parity write data PWD may be provided to an encoder circuit 510, which may encode the parity data PWD into the write parities WP'. The write parities WP' are provided to a converter circuit 505 which generates the write parities WP, which are written to the memory array as the parity bits P.

The converter circuit 505 includes an XOR logic gate 505a and a third multiplexer 505b. The XOR logic gate 505a has input terminals coupled to the syndrome bits S and the write parity bits WP'. The XOR logic gate 505a provides an output which is at a high logical level when the syndrome bite S is different from the associated write parity bit WP'. The third multiplexer 505b provides either the output of the XOR logic gate 505a or the write parity WP' as the write parity WP. The multiplexer 505b choses the source of the write parity WP bits based on a conversion signal EDM.

When the conversion signal EDM is active, the write parity WP is the output of the XOR gate 505a. When the conversion signal EDM is inactive, the signal WP' is provided as the signal WP.

A mask error detector circuit 560 provides the signal EDM based on the syndrome bits S and on the data mask DM. The mask error detector circuit 560 may determine whether or not burst data to which an error bit belongs and burst data masked by the data mask signal DM are coincident. If they are coincident, then the signal EDM may be activated. If they are not coincident, the signal EDM may remain inactive.

Figure 6:
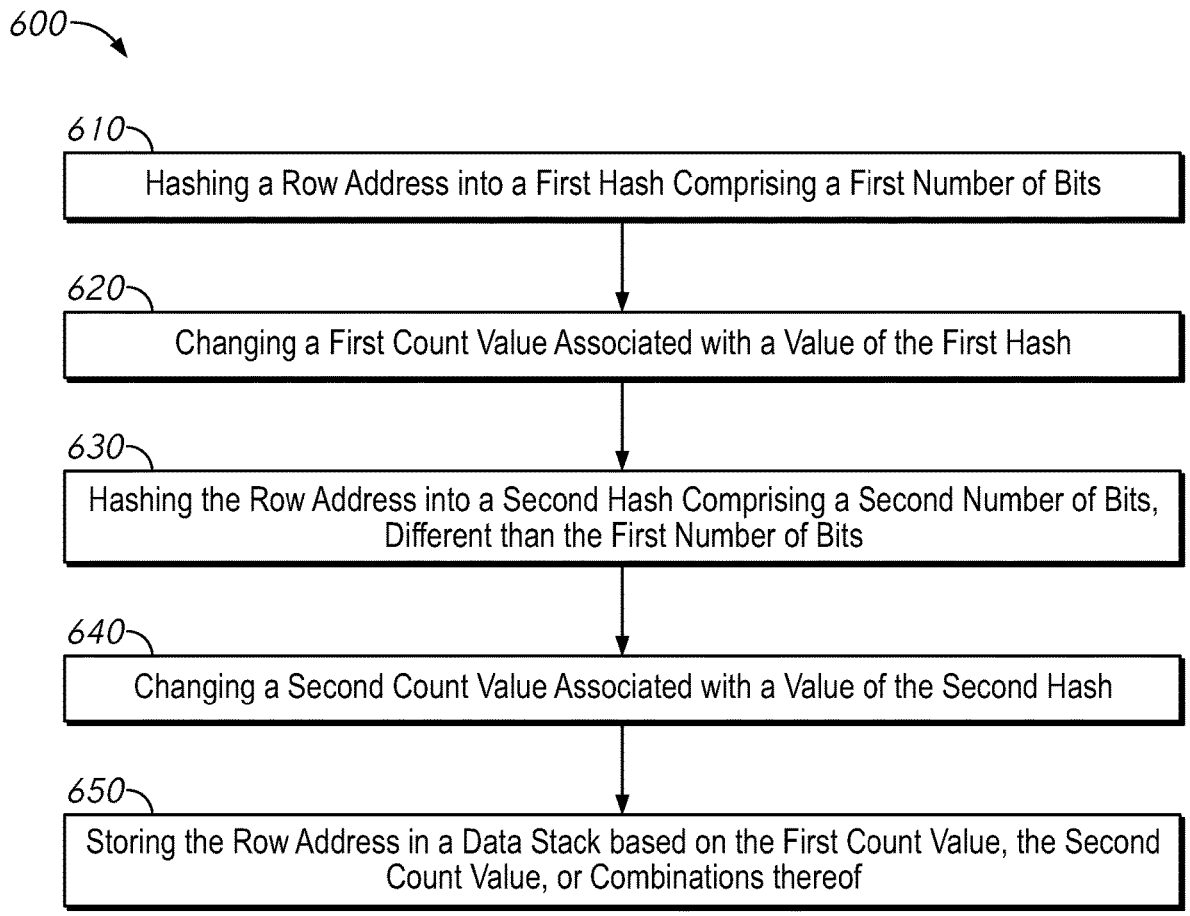
FIG. 6 is a block diagram of a method of tracking row addresses associated with errors according to some embodiments of the present disclosure.

FIG. 6 is a block diagram of a method of tracking row addresses associated with errors according to some embodiments of the present disclosure. The method 600 may, in some embodiments, be implemented by one or more of the components discussed in FIGS. 1-5. While a certain sequence of operations is discussed with respect to the method 600, it should be understood that certain operations may be performed in a different order, repeated, and/or omitted in other embodiments. Certain steps may happen simultaneous to each other in some embodiments.

The method 600 may generally begin with block 610, which describes hashing a row address into a first hash comprising a first number of bits. The first hash circuit (e.g., 212 of FIG. 2) may be an m-bit hash. The first number of bits may generally be shorter than the length of the row address. Accordingly, the first hash may be associated with a first set of row addresses.

Block 610 may generally be followed by block 620, which describes changing a first count value associated with a value of the first hash. The first hash may be used as an index for a first set of count values (e.g., stored in data storage structure 210 of FIG. 2). The count value associated with the value of the first hash may be changed, for example, incremented (e.g., by count adjustor 208).

Block 610 and 620 may generally happen simultaneously with blocks 630 and 640. Block 630 describes hashing the row address into a second hash comprising a second number of bits. The second number of bits may be different than the first number of bits. The second hash may be generated by a second hash circuit (e.g., 222 of FIG. 2), and may be a n-bit hash. The n-bit hash may also be shorter than the number of bits of the row address.

Block 630 may generally be followed by block 640, which describes changing a second count value associated with a value of the second hash. The second hash may be used as an index for a second set of count values (e.g., stored in data storage structure 220 of FIG. 2). The count value associated with the value of the second hash may be changed, for example, by being incremented.

Blocks 620 and 640 may generally be followed by block 650, which describes storing the row address in a data stack based on the first count value, the second count value, or combinations thereof. For example, a count locator circuit (e.g., 204 of FIG. 2) may select the minimum of the first count value and the second count value as a comparison value and compare it to a threshold value. If the comparison value is greater than the threshold, then the received row address may be stored in a problem address storage data structure (e.g., 242 of FIG. 2). Example embodiments may use other values as the comparison value include other statistics such as the mean or the median, or selecting a particular count value based on which data structure the count value was stored in. In some embodiments, how the comparison value is chosen may be user selectable. In some embodiments, multiple comparison values may be generated, each may be compared to the threshold, and the memory may have multiple problem address storage structures which store addresses based on different comparison values.

Figure 7:
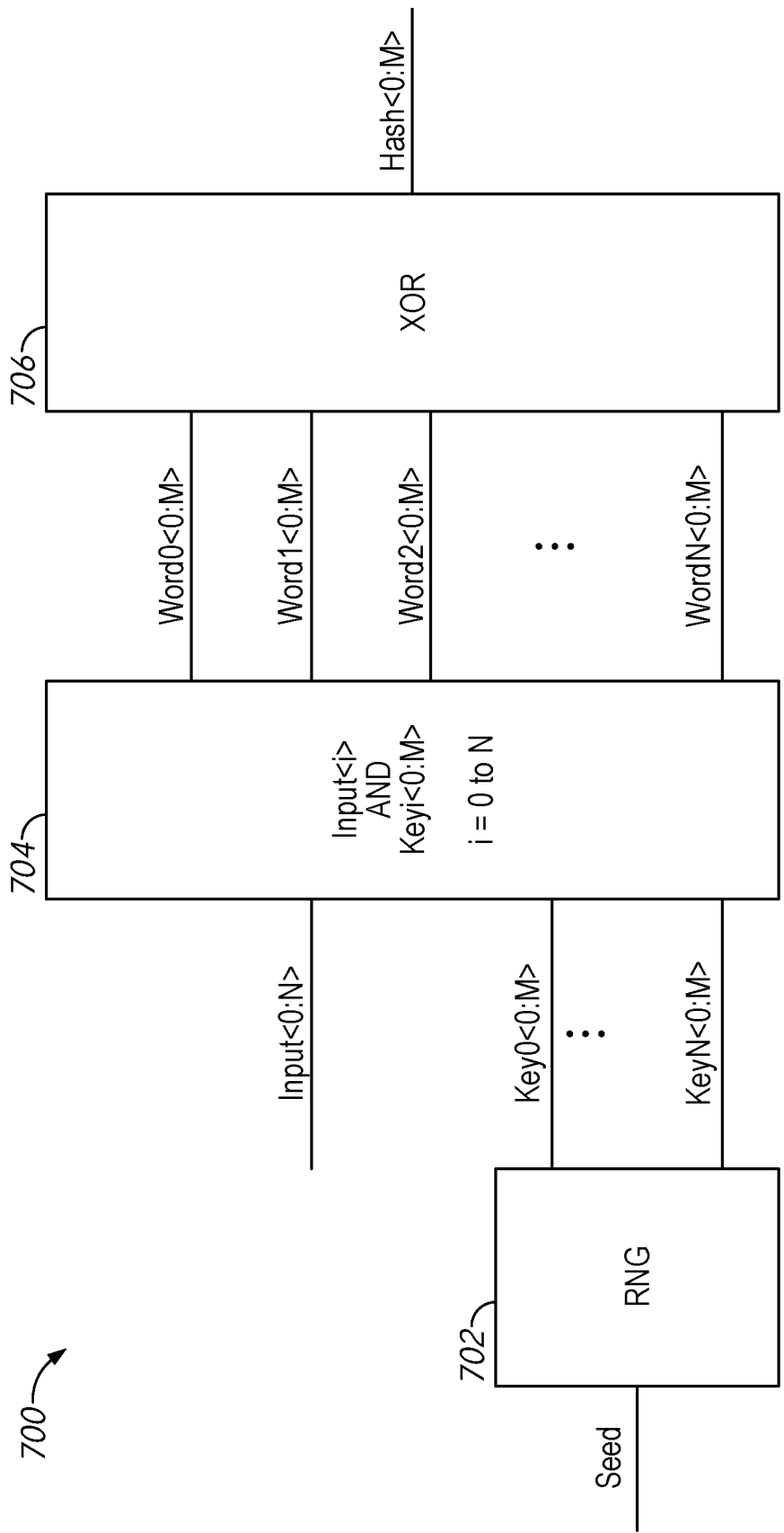
FIG. 7 is a block diagram of a hash circuit according to some embodiments of the present disclosure

FIG. 7 is a block diagram of a hash circuit according to some embodiments of the present disclosure. The hash circuit 700 may, in some embodiments, be used as the hash circuits 212, 222, and/or 232 of FIG. 2. The hash circuit 700 of FIG. 7 represents a simplified view of the operation of a hash circuit, in order to explain the general operation of a hash circuit. Hash circuits of the present disclosure may use more complicated logic and/or other processes to convert the input signal into the hash.

The hash circuit 700 of FIG. 7 is shown as including a random number generator (RNG) 702, which may be used to generate the set of hash keys Key based on a seed value Seed. In the embodiment of FIG. 7, the RNG 702 may be included in the hash circuit 700, and the hash circuit may directly receive the seed value Seed in order to generate a set of keys. In some embodiments, the RNG 702 may be a system level component, and may not be included in each individual hash circuit. In some embodiments, the RNG 702 may be omitted and other methods may be used to generate the keys Key.

The hash circuit 700 may receive an input value Input, which may be an N+1 bit number (e.g., Input<0:N>). In some embodiments, the value Input may be a row address. The hash circuit 700 may generate an output value Hash, which may be an M+1 bit number (e.g., Hash<0:M). The value M may generally be a smaller number than the value N.

The RNG 702 generates a set of keys which is based on the values N and M. Specifically, the RNG 402 generates N+1 keys, each of which is of length M+1. Block 704 may combine each key from the set of keys with a bit of the input value. For example, each bit of the input value (e.g., Input<i>) may be combined with a corresponding one of the keys Ki<0:M> to generate a Word. So a first bit may be combined with a first key, and so forth. In the example of FIG. 7, AND logic may be used to combine each bit of the input with the associated key. Each word may be an M+1 bit length and after combining each bit of the Input with the associated key, there may be a set of N+1 words.

Block 706 may combine the words together to generate the output Hash. In the example of FIG. 7, XOR logic may be used to combine all of the Words together. Once the words have been combined, the output may be an output value Hash which is M+1 bits in length.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a first hash circuit configured to receive a row address and hash the received row address to a first hash comprising a first number of bits;
a first plurality of registers configured to store a first set of count values;
a second hash circuit configured to receive the row address and hash the received row address to a second hash comprising a second number of bits different from the first number of bits;
a second plurality of registers configured to store a second set of count values;
a count logic circuit configured to retrieve a first count value of the first stored set of count values selected based on the first hash, retrieve a second count value of the second stored set of count values selected based on the second hash, and compare the first count value, the second count value, or combinations thereof to a threshold; and
a problem address storage structure configured to store the row address as a stored problem address if the first count value, the second count value, or combinations thereof exceed the threshold.

2. The apparatus of claim 1, further comprising:
a memory array configured to provide read data based, in part, on a row address; and
an error correction code (ECC) circuit configured to detect errors in the read data, and provide an error detected signal at an active level when an error is detected, wherein the first hash circuit and the second hash circuit are configured to receive the row address as the received row address when the error detected signal is at the active level.

3. The apparatus of claim 1, wherein the count logic circuit is configured to increment the first count value and the second count value.

4. The apparatus of claim 1, wherein the count logic circuit is configured to provide a command signal at an active level based on comparing a minimum, a median, a mean, or combinations thereof, of the first count value and the second count value to the threshold, wherein the problem address storage structure is configured to store the received row address responsive to the command signal at the active level.

5. The apparatus of claim 1, further comprising a count adjustor circuit configured to reset the first count value and the second count value based on a timer.

6. The apparatus of claim 1, further comprising a random number generator configured to provide a random number, wherein the threshold is adjusted based on the random number.

7. The apparatus of claim 1, wherein the first count value is associated with a first number of row address values, and wherein the second count value is associated with a second number of row address values, different than the first number.

8. An apparatus comprising:
a memory array comprising a plurality of word lines;
an error correction code (ECC) circuit configured to identify a row address based on one or more errors in data read from one of the plurality of word lines associated with the row address;
a first hash circuit configured to receive the row address and hash the received row address to a first hash;
a first stack comprising a first plurality of registers, the first plurality of registers configured to store a first set of count values each of which is associated with a first number of the plurality of word lines, wherein the first stack is configured to provide a first count value selected based on the first hash;
a second hash circuit configured to receive the row address and hash the received row address to a second hash;
a second stack comprising a second plurality of registers, the second plurality of registers configured to store a second set of count values each of which is associated with a second number of the plurality of word lines, wherein the second number is different than the first number, and wherein the second stack is configured to provide a second count value selected based on the second hash; and
a problem address storage configured to store the identified row address based on the first count value, the second count value, or combinations thereof.

9. The apparatus of claim 8, further comprising a count logic circuit configured to compare the first count value to a threshold and increase the second count value responsive to the first count exceeding the threshold, and wherein the count logic circuit is further configured to retrieve the first count value of the stored first set of count values selected based on the first hash and retrieve the second count value of the stored second set of count values selected based on the second hash.

10. The apparatus of claim 9, wherein the problem address storage is configured to store the identified row address based on the second count value.

11. The apparatus of claim 8, further comprising a count logic circuit configured to provide a command signal at an active level when a comparison value exceeds a threshold, wherein the comparison values is a minimum, a mean, a median, or combinations thereof of the first count value and the second count value, and wherein the problem address storage is configured to store the identified row address based on the command signal at the active level.

12. The apparatus of claim 11, wherein the threshold is based, in part, on a random number.

13. The apparatus of claim 8,
wherein the first hash acts as an index for the first plurality of registers of the first stack, and
wherein the second hash acts as an index for the second plurality of registers of the second stack, wherein the first hash and the second hash are different lengths.

14. The apparatus of claim 13, wherein the first hash comprises a first number of bits, and wherein the second hash comprises a second number of bits different than the first number of bits.

15. The apparatus of claim 14, wherein the row address comprises a third number of bits, and wherein the first number of bits and the second number of bits are each smaller than the third number of bits.

16. A method comprising:
receiving a row address;
hashing the row address into a first hash comprising a first number of bits;
selecting a first count value from a first plurality of count values based on a value of the first hash;
changing the first count value;
hashing the row address into a second hash comprising a second number of bits, different than the first number of bits;
selecting a second count value from a second plurality of count values based on a value of the second hash;
changing the second count value;
comparing the first count value, the second count value, or combinations thereof to a threshold; and
storing the row address in a data stack based on the comparison.

17. The method of claim 16, further comprising:
reading data from a memory array based on the row address;
determining if the data includes any error with an error code correction (ECC) circuit; and
hashing the row address into the first hash and hashing into the second hash if the data includes at least one error.

18. The method of claim 16, further comprising storing the row address in the data stack based on a mean, a median, a minimum, or combinations thereof of the first count value and the second count value exceeding a threshold.

19. The method of claim 16, further comprising changing the second count value if the first count value is above a threshold.

20. The method of claim 19, further comprising storing the row address in the data stack based on a comparison of the second count value to a second threshold.

* * * * *